(12) United States Patent
Park et al.

(10) Patent No.: US 7,554,401 B2
(45) Date of Patent: Jun. 30, 2009

(54) POWER AMPLIFIER

(75) Inventors: Changkun Park, Gyeongsangnam-do (KR); Ki Yong Son, Incheon (KR); Songcheol Hong, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 27 days.

(21) Appl. No.: 11/812,068

(22) Filed: Jun. 14, 2007

(65) Prior Publication Data

US 2008/0007335 A1    Jan. 10, 2008

(30) Foreign Application Priority Data

Jun. 26, 2006 (KR) .................. 10-2006-0057348

(51) Int. Cl.
*H03F 3/45* (2006.01)
(52) U.S. Cl. ..................................... 330/253
(58) Field of Classification Search ................. 330/253
See application file for complete search history.

(56) References Cited

U.S. PATENT DOCUMENTS 5,805,021 A    9/1998   Brehmer 7,339,427 B2 *    3/2008   Macphail ................. 330/251

OTHER PUBLICATIONS

Choi, K. et al., "A 900MHz GSM PA In 250nm CMOS With Breakdown Voltage Protection And Programmable Conduction Angle*," IEEE Radio Frequency Integrated Circuits Symposium, TU1C-4, pp. 369-372, Jun. 2004.

* cited by examiner

*Primary Examiner*—Robert Pascal
*Assistant Examiner*—Khiem D Nguyen
(74) *Attorney, Agent, or Firm*—Oliff & Berridge, PLC

(57) ABSTRACT

A power amplifier based on a voltage-coupling scheme is disclosed. The power amplifier includes two active elements connected to each other via a primary part of a transformer, in which one of the two active elements is connected to a power-supply voltage of the amplifier, the other one is connected to a ground terminal of the amplifier, and an output power appears in a secondary part of the transformer. Therefore, a potential difference between ports of the active elements is decreased, resulting in increased reliability of the power amplifier.

16 Claims, 11 Drawing Sheets (a)

(b)

(a)

(b)

(a)

(b)

POWER AMPLIFIER

BACKGROUND OF THE INVENTION

1. Field of the Invention

The present invention relates to a power amplifier based on a voltage-coupling scheme, and more particularly to a power amplifier for use in a wireless communication system, in which two active elements are connected to each other via a primary part of a transformer, one of the two active elements is connected to a power-supply voltage of the power amplifier, the other one is connected to a ground terminal of the power amplifier, and an output power appears in a secondary part of the transformer, such that it decreases a potential difference between ports of the active elements, resulting in increased reliability of the power amplifier.

2. Description of the Related Art

Generally, the magnitude of output power of the power amplifier for use in a wireless communication system is proportional to the square of a power-supply voltage, and is inversely proportional to a load resistance value, as shown in the following Equation 1:

$$P_{out} \propto \frac{V_{DD}^2}{R_{load}} \quad \text{[Equation 1]}$$

Therefore, a method for reproducing the load resistance value must be added to a method for acquiring the high output power. However, the above-mentioned method has difficulty in configuring an output matching circuit of a high-frequency power amplifier.

If the load resistance is decreased, total efficiency of the power amplifier is decreased as can be seen from the following Equation 2:

$$\text{Efficiency} \propto \frac{R_{load}}{R_{load} + R_{on}} \quad \text{[Equation 2]}$$

In Equation 1, $V_{DD}$ is indicative of a power-supply voltage of the power-supply, and $R_{load}$ is indicative of a load resistance value of the power amplifier.

In Equation 2, $R_{on}$ is indicative of an ON-resistance value of the power element.

Therefore, the increasing of the power-supply voltage will be efficient for the high output power.

However, with the increasing demand of a high frequency circuit having a higher operation frequency, a fabrication process for the most general semiconductor element such as a CMOS has been continuously developed, resulting in implementation of the channel length of a sub-micron unit.

Due to the reduction of the channel length caused by the fabrication process, a breakdown voltage of the active element can also be lowered.

Generally, a power-supply voltage of a mobile phone is set to 3.3V. The highest voltage at a drain terminal (D) of the NMOS transistor 200 of the general power amplifier shown in FIG. 1 is equal to about three times the power-supply voltage.

FIG. 1 is a circuit diagram illustrating a power amplifier including a single NMOS according to a first example of the conventional art.

The breakdown voltage is about 5V in consideration of the NMOS based on the CMOS-0.18 μm fabrication process, such that a general power amplifier shown in FIG. 1 can be made unavailable under the condition of the power-supply voltage 3.3V.

In order to solve the above-mentioned problem, there is proposed a cascode structure shown in FIG. 2.

FIG. 2 is a circuit diagram illustrating a power amplifier in which a cascode structure is implemented by two NMOS transistors according to a second example of the conventional art.

The cascode structure has been widely used as a general structure. A representative cascode structure has been disclosed in the paper, entitled "A 900 MHz GSM PA in 250 nm CMOS with Breakdown Voltage Protection and Programmable Conduction Angle", and filed by K. Choi, D. J. Allstot, and Krishnamurthy, in IEEE RFIC Symposium, pp. 359-372, June 2004.

As shown in FIG. 2, provided that a first NMOS transistor 201 is connected to a second NMOS transistor 202, although the highest voltage condition of about 10V is provided at a drain terminal D of the first NMOS transistor 201, the first NMOS transistor 201 copes with 5V and the second NMOS transistor 202 copes with 5V, such that individual elements do not reach the breakdown voltage, and the power amplifier can be normally operated.

However, according to the above-mentioned method, the second NMOS transistor 202 is designed to amplify the input signal, and the first NMOS transistor 201 is designed to undergo a high drain voltage.

The ON resistance value of the first NMOS transistor 201 is added to that of the second NMOS transistor 202, such that overall efficiency of the power amplifier is decreased as shown in Equation 2.

In the meantime, a power-supply voltage of a battery of a mobile phone increases to 4.2V after the battery is completely charged with electricity. In this case, the power amplifier of FIG. 2 is unable to endure the high drain voltage, such that an element breakdown and a deterioration of reliability of the power-supply are generated.

In order to solve the above-mentioned element breakdown problem, another conventional art shown in FIG. 3 may also be introduced to the market.

FIG. 3 is a circuit diagram illustrating a power amplifier in which three NMOS transistors are connected according to a third example of the conventional art.

However, since the power amplifier of FIG. 3 interconnects NMOS transistors 203, 204, and 205 acting as active elements in series to each other, the ON resistance value caused by the serial connection of the above NMOS transistors 203, 204, and 205 unavoidably increases, such that overall efficiency of the power-supply is lowered.

In conclusion, the above-mentioned conventional arts have difficulty in implementing a power amplifier capable of being normally operated simultaneously while acquiring high efficiency at a high power-supply voltage.

SUMMARY OF THE INVENTION

Therefore, the present invention has been made in view of the above problems, and it is an object of the present invention to provide a power amplifier for reducing a potential difference between ports of active elements, thereby improving reliability.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In accordance with one aspect of the present invention, the above and other objects can be accomplished by the provision of a power amplifier comprising: two active elements connected to each other via a primary part of a transformer, in which one of the two active elements is connected to a power-supply voltage of the amplifier, the other one is connected to a ground terminal of the amplifier, and an output power appears in a secondary part of the transformer.

Preferably, the active element connected to the ground terminal is a NMOS (N-type Metal Oxide Semiconductor) transistor, and the other active element connected to the power-supply voltage is a PMOS (P-type Metal Oxide Semiconductor) transistor.

Preferably, the NMOS transistor has a cascode structure.

Preferably, the PMOS transistor has a cascode structure.

Preferably, the NMOS transistor and the PMOS transistor have a cascode structure.

Preferably, the power amplifier further includes: a signal input unit for transmitting input signals having opposite phases to the two active elements.

In accordance with another aspect of the present invention, there is provided a differential amplifier in which two amplifiers of claim 6 are connected to each other, comprising: first and second amplifiers, in which a ground terminal of the first amplifier is connected to that of the second amplifier, a power-supply voltage of the first amplifier is connected to that of the second amplifier; and a signal input unit for transmitting input signals having opposite phases to two active elements, which are connected to the ground terminals and the power-supply voltages of the first and second amplifiers, in which a secondary part of a transformer of the first amplifier is connected to that of the second amplifier, such that output signals of the first and second amplifiers are coupled to each other via the secondary part of the transformer.

Preferably, the differential amplifier further includes: other differential amplifiers, each of which has the same differential structure as that of the differential amplifier, connected to the differential amplifier via the secondary part of the transformer contained in the amplifiers.

Preferably, the two active elements connected to the ground terminals are NMOS transistors, respectively, and the other two active elements connected to the power-supply voltages are PMOS transistors, respectively.

Preferably, the gate terminals of the two PMOS transistors for constructing a pair of PMOS transistors to form the differential structure are connected to drain terminals of different PMOS transistors.

Preferably, the gate terminals of the two PMOS transistors for constructing a pair of PMOS transistors to form the differential structure are connected to drain terminals of the NMOS transistors connected via a primary part of the transformer.

Preferably, the gate terminals of the two NMOS transistors for constructing a pair of NMOS transistors to form the differential structure are connected to drain terminals of different NMOS transistors.

Preferably, the gate terminals of the two NMOS transistors for constructing a pair of NMOS transistors to form the differential structure are connected to drain terminals of PMOS transistors connected to the NMOS transistors via the primary part of the transformer.

In accordance with still another aspect of the present invention, there is provided a distributed-type or circular-geometry-type amplifier equipped with a plurality of amplifiers of claim 1, comprising: a plurality of amplifiers connected to each other via a secondary part of a transformer, in which a ground terminal connected to an active element of a specific amplifier from among the amplifiers is connected to a ground terminal connected to an active element of a neighboring amplifier, and a power-supply voltage connected to the active element of the specific amplifier is connected to a power-supply voltage connected to the active element of the neighboring amplifier.

Therefore, the present invention can reduce a potential difference between ports of active elements, resulting in the increased reliability of the power amplifier.

It is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
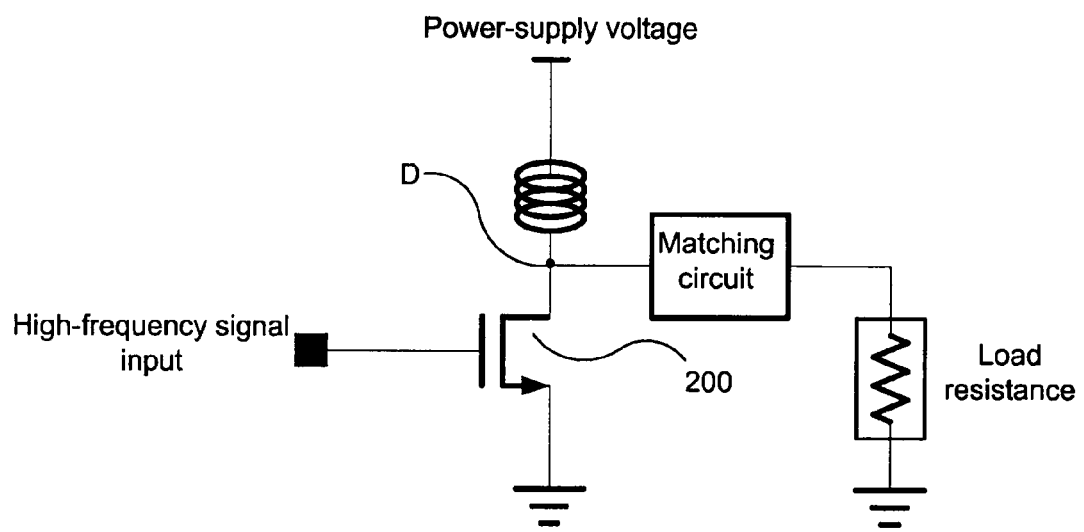
FIG. 1 is a circuit diagram illustrating a power amplifier including a single NMOS according to a first example of the conventional art.
Figure 2:
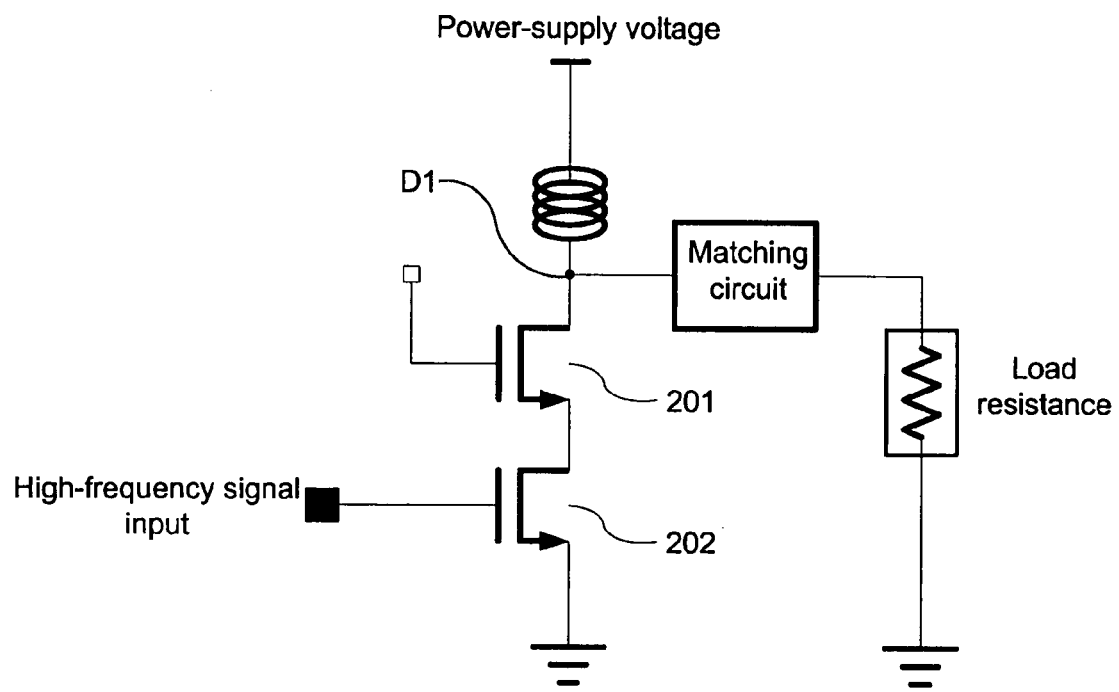
FIG. 2 is a circuit diagram illustrating a power amplifier in which a cascode structure is implemented by two NMOS transistors according to a second example of the conventional art.
Figure 3:
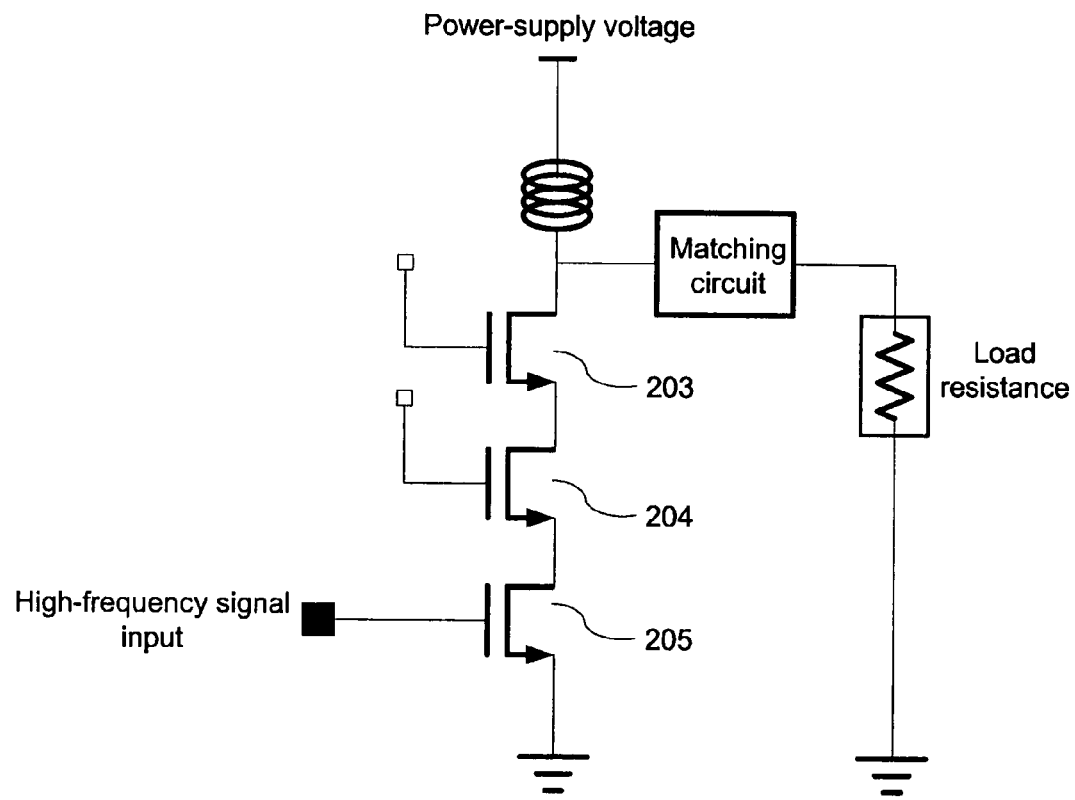
FIG. 3 is a circuit diagram illustrating a power amplifier including three NMOS transistors according to a third example of the conventional art.
Figure 4:
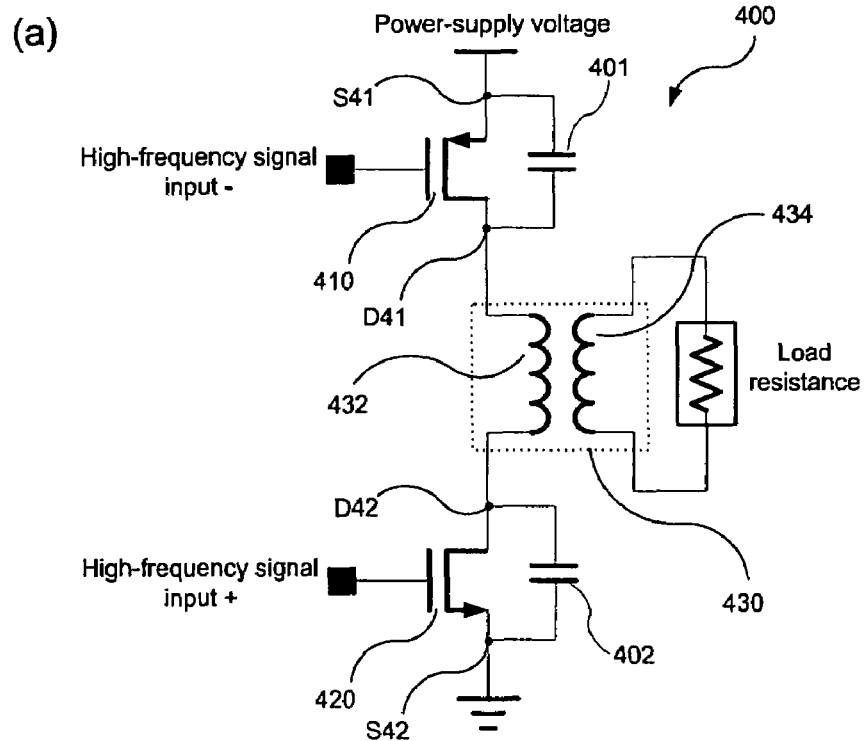
FIG. 4 is a circuit diagram illustrating a power amplifier using a transformer according to a preferred embodiment of the present invention.
Figure 4:
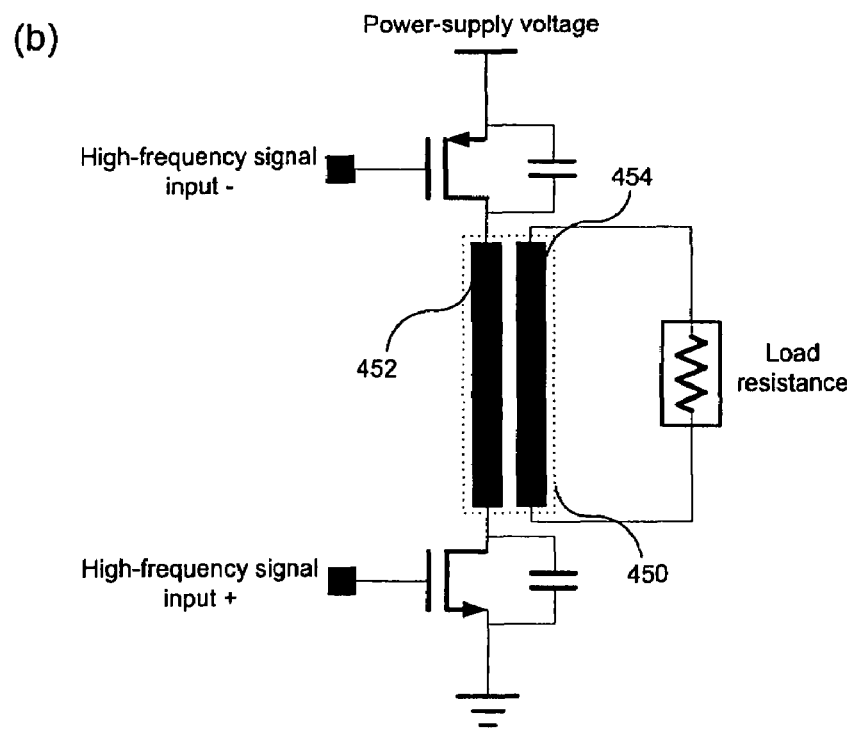

Now, preferred embodiments of the present invention will be described in detail with reference to the annexed drawings. In the drawings, the same or similar elements are denoted by FIG. 4 is a circuit diagram illustrating a power amplifier using a transformer according to a preferred embodiment of the present invention.

FIG. 4A shows an exemplary case in which a transformer is used. FIG. 4B shows an exemplary case in which a transmission line transformer is used.

Referring to FIG. 4B, the power amplifier 400 includes a PMOS transistor 410, a NMOS transformer 420, and a transformer 430. A primary part 432 of the transformer 432 is located between the drain D41 of the PMOS transistor 410 and the drain D42 of the NMOS transistor 420, and a secondary part 434 of the transformer faces the primary part.

A source terminal S41 of the PMOS transistor 410 is connected to a power-supply voltage, and a source terminal S42 of the NMOS transistor 420 is connected to a ground terminal. In this case, if the signal input unit (not shown) transmits differential signals having a phase difference of 180° to gate terminals of the PMOS and NMOS transistors 410 and 420, the NMOS and PMOS transistors 420 and 410 are simultaneously switched off or on.

If the NMOS transistor 420 and the PMOS transistor 410 are simultaneously switched on, the power-supply voltage terminal and the ground terminal are connected to each other via the primary part 432 of the transformer 430 having parasitic inductance components.

In this case, a current signal flows in the primary part 432 of the transformer 430 due to a potential difference between the power-supply voltage terminal and the ground terminal, such that magnetic energy is accumulated in the primary part 432 of the transformer 430.

Thereafter, the NMOS transistor 420 and the PMOS transistor 410 are simultaneously switched off, the magnetic energy stored in the primary part 432 of the transformer 430 are converted into electric energy by two capacitors 401 and 402 shown in FIG. 4, such that the output power appears.

The above-mentioned two capacitors 401 and 402 shown in FIG. 4 can be implemented by parasitic capacitances of the NMOS and PMOS transistors 420 and 410 and additional capacitors thereof.

In this case, magnetic energy stored in the primary part 432 of the transformer 430 is divided into two capacitors 401 and 402, such that it is divisionally converted into electric energy by the two capacitors 401 and 402. Therefore, a potential difference between drain and source terminals of the NMOS and PMOS transistors 420 and 410 is lower than that of the conventional art.

The highest voltage of the drain-source potential difference according to the present invention is about 1.5 times a power-supply voltage, whereas a potential difference between drain and source terminals of the NMOS transistor for use in the conventional power amplifier maximally increases to three times a power-supply voltage. Therefore, the power amplifier according to the present invention has a lower potential difference applied to the active elements as compared to the conventional art, resulting in increased reliability of the circuit.

As can be seen from FIG. 4, the NMOS transistor 420 is selected as an active element connected to the ground terminal, the PMOS transistor 410 is selected as an active element connected to the power-supply voltage.

FIG. 4B shows an exemplary case in which a transmission-line transformer 450 for use in the high-frequency circuit is used as the transformer of FIG. 4A. If the transmission-line transformer is used as shown in FIG. 4B, the power amplifier with an operation area of several GHZ bands can be implemented such that it is suitable for the output power of several watts. The remaining constituent components other than the transmission-line transformer 450 are equal to those of FIG. 4A, such that reference numbers thereof will herein be omitted for the convenience of description.

As can be seen from FIG. 4 illustrating an example of the inventive power amplifier, RF power is generated from not only the drain of the NMOS transistor but also the drain of the PMOS transistor. The above-mentioned characteristics of the present invention are different from those of the conventional cascode structure in which only one active element from among two active elements generates the RF power, as shown in FIG. 5.

Figure 5:
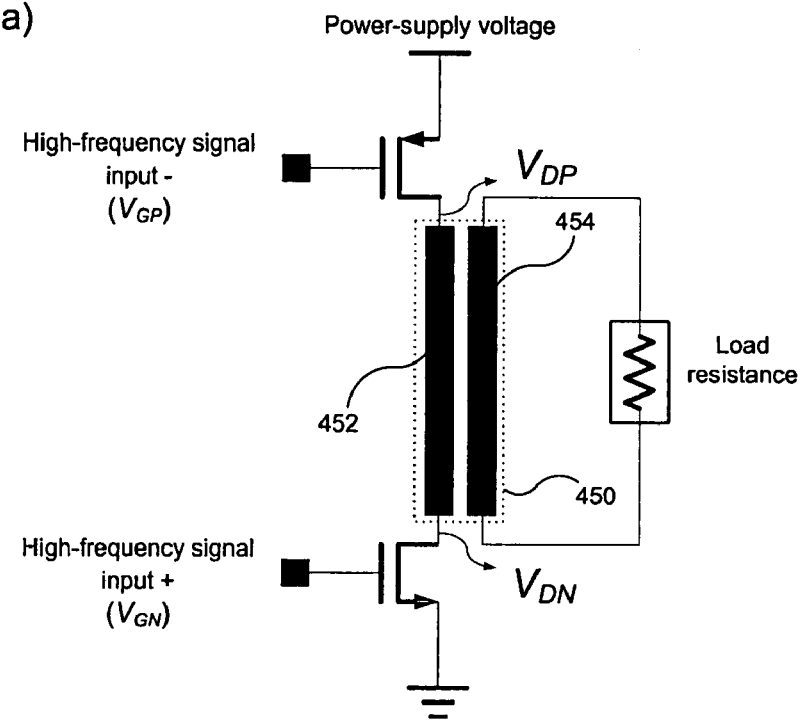
FIG. 5 is a conceptual diagram illustrating operations of a power amplifier, and voltage waveforms of individual points of the power amplifier according to a preferred embodiment of the present invention.
Figure 5:
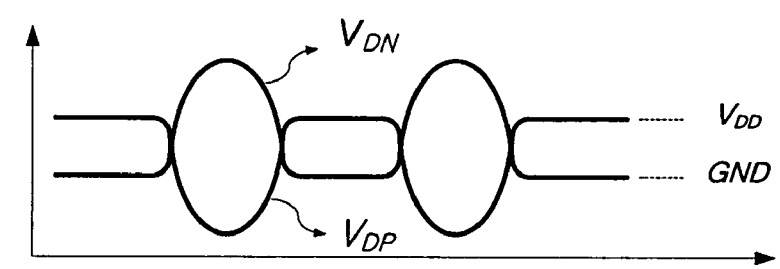
Figure 5:
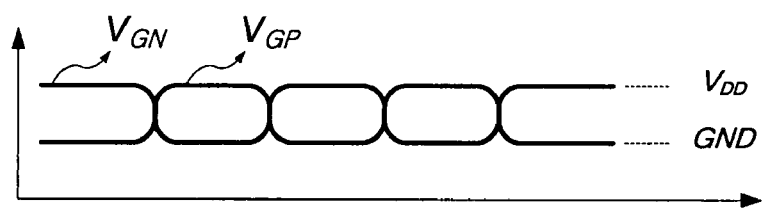

FIG. 5 is a conceptual diagram illustrating operations of a power amplifier, and voltage waveforms of individual points of the power amplifier according to a preferred embodiment of the present invention. If the capacitor connected in parallel to the transistor is removed from the power amplifier of FIG. 4B, the power amplifier of FIG. 5A can be acquired.

FIG. 5B shows input waveforms ($V_{GP}$ and $V_{GN}$) of the PMOS and NMOS transistors 410 and 420 and waveforms ($V_{DP}$ and $V_{DN}$) of the drain terminals of the PMOS and NMOS transistors 410 and 420.

Therefore, a voltage difference between the PMOS drain voltage ($V_{DP}$) and the NMOS drain voltage ($V_{DN}$) of the power amplifier according to the present invention appears in both ends of the primary part 452 of the transformer. The same voltage difference also appears in the second part 343 of the transformer. A current signal flowing in the primary part 452 encounters mutual induction electromotive force, such that the secondary part 454 of the transformer 450 generates a current signal by the mutual induction electromotive force. In this way, the power generated by the two active elements appears as an output power through the medium of the transformer 450.

Figure 6:
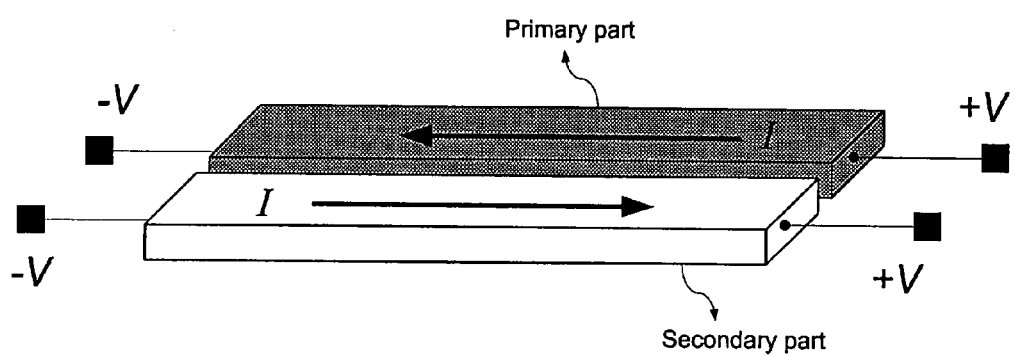
FIG. 6 is a conceptual diagram illustrating the operation principles of a general transmission-line transformer.

The above-mentioned transformer indicates basic operation principles of the transformer via the transmission-line transformer of FIG. 6. For the convenience of description, it is assumed that the coupling coefficient of FIG. 6 is set to "1". FIG. 6 is a conceptual diagram illustrating the operation principles of a general transmission-line transformer.

In this case, the magnitude of a current signal flowing in the secondary part of the transformer is equal to an amount of a current signal flowing in the primary part of the transformer, and the direction of the current signal flowing in the secondary part is opposite to that of the primary part.

A potential difference between both ends of the primary part of the transformer appears in the second part of the transformer without any change.

In the meantime, a general CMOS fabrication technique does not provide a Via-process, differently from a fabrication technique of a compound semiconductor element. Therefore, if the design or layout of the high-frequency circuit is implemented with the CMOS, circuit characteristics are deteriorated due to parasitic inductance, capacitance, and resistance components created when a ground is implemented in the circuit.

In order to solve the above-mentioned problem, a high-frequency circuit of a differential structure has been widely used throughout the world. A virtual ground can be easily implemented in the above-mentioned differential high-frequency circuit. The differential high-frequency circuit can more effectively protect circuit characteristics from being deteriorated as compared to the in-phase high-frequency circuit.

Figure 7:
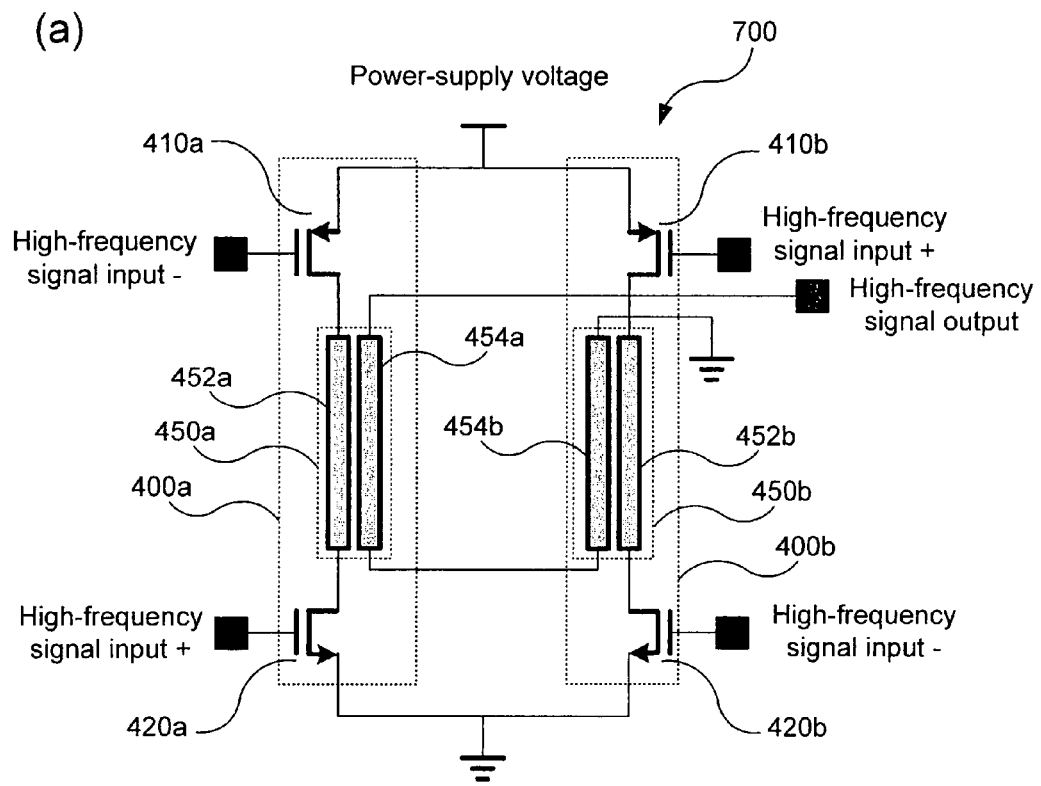
FIG. 7 is a structural diagram illustrating a power amplifier to which a differential amplification structure is applied according to another preferred embodiment of the present invention.
Figure 7:
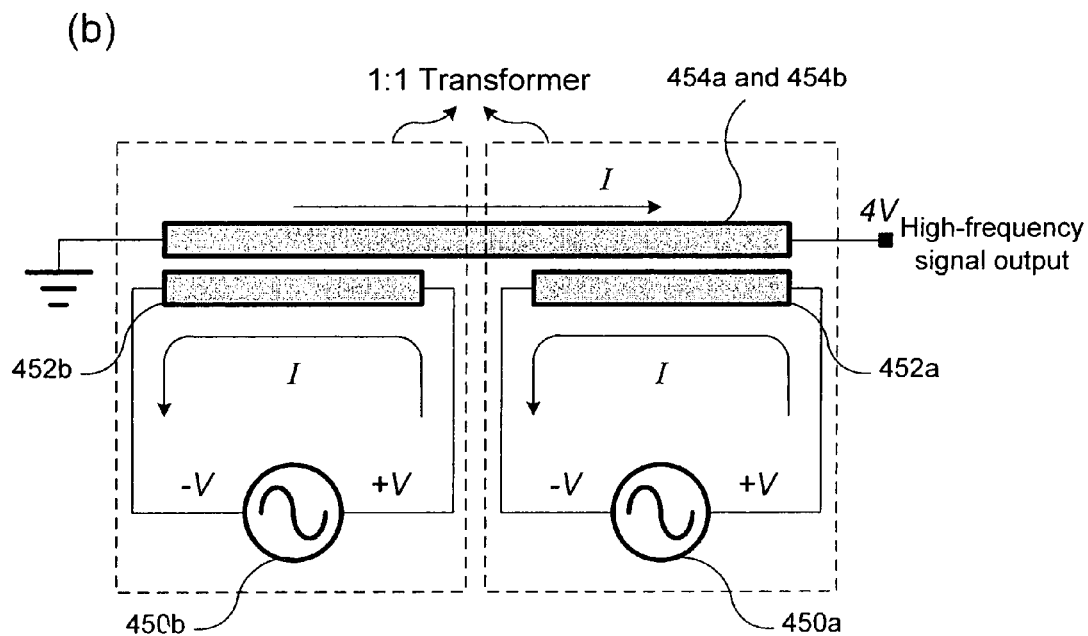

FIG. 7 is a structural diagram illustrating a power amplifier to which a differential amplification structure is applied according to another preferred embodiment of the present invention.

In more detail, FIG. 7A is a circuit diagram of the differential amplifier, and FIG. 7B is a simplified circuit diagram by which a user can easily understand operations of the differential amplifier shown in FIG. 7A.

Referring to FIG. 7A, the first power amplifier 400a and the second power amplifier 400b other than the load resistance in the power amplifier of FIG. 5A are connected to each other, such that it can be recognized that a differential amplifier is implemented.

In more detail, a ground terminal of the first power amplifier 400a is connected to that of the second power amplifier 400b, and a power-supply voltage of the first power amplifier 400a is connected to that of the second power amplifier 400b. And, a secondary part 454a of the transmission line transformer contained in the first power amplifier 400a is connected to a secondary part 454b of the transmission line transformer contained in the second power amplifier 400b, such that output signals of the first and second power amplifiers 400a and 400b are coupled to each other via the secondary part of the transformer.

In the case of operating the differential amplifier shown in FIG. 7A, the signal input unit (not shown) applies input signals having opposite phases to two active elements connected to the ground terminal, i.e., the first PMOS transistor 410a and the second PMOS transistor 410b. In this way, the signal input unit (not shown) applies input signals having opposite phases to two active elements (i.e., first and second NMOS transistors 420a and 420b) connected to the power-supply voltage.

As can be seen from FIG. 7B, a voltage difference of 2V (i.e., (+V)−(−V)=2V) exists in both ends of the primary parts 452a and 452b of the 1:1 transformer. The above-mentioned voltage difference of 2V also appears in the secondary part without any change. The two 1:1 transformers are connected in the form of a cascade structure, such that the voltage difference generated in the primary part of the transformer is unexpectedly overlapped with each other.

Therefore, a voltage difference of 4V appears in both ends of the secondary parts (454a and 454b) of the transformer as can be seen from FIG. 7B. The 1:1 transformers are connected in the form of a cascade structure, the amount of a current signal flowing in the secondary parts 454a and 454b is equal to an amount of current signals of the primary parts.

In conclusion, in association with the input power represented by the product of current signal and voltage signal of two primary parts of FIG. 7B, the output power having the same magnitude as that of the input power appears in the secondary part due to the voltage overlapping.

In order to apply a technique equal to the above-mentioned technique to the power amplifier structure according to the present invention, the circuit of FIG. 7A configures the inventive power amplifier in the form of a differential amplifier, and a single NMOS transistor from among a pair of NMOS transistors 420a and 420b and a single PMOS transistor from among a pair of PMOS transistors 410a and 410b makes a pair.

In other words, the first NMOS transistor 420a and the first PMOS transistor 410a make a pair, such that they are interconnected via the primary part 452a of the 1:1 transformer. The second NMOS transistor 420b and the second PMOS transistor 410b make a pair, such that they are interconnected via the primary part 452b of the 1:1 transformer. Two 1:1 transformers are connected to each other via the secondary part, such that the power amplifier based on the voltage coupling scheme of FIG. 7B can be implemented.

In order to acquire the higher output power by extending the above-mentioned principles, a plurality of differential amplifiers shown in FIG. 7A are interconnected in the form of a cascade.

Figure 8:
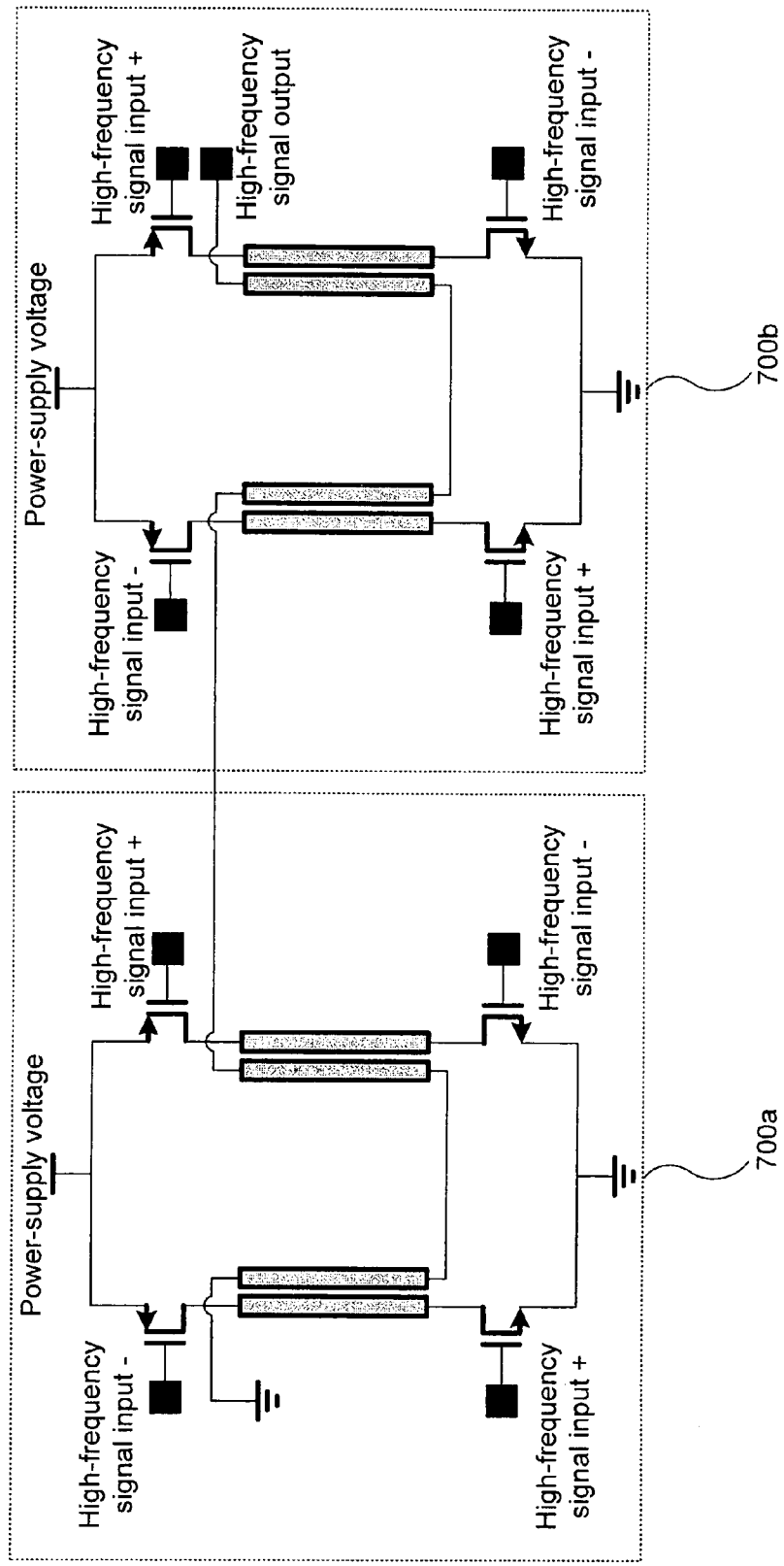
FIG. 8 is a structural diagram illustrating a power amplifier for increasing an output power according to still another preferred embodiment of the present invention.

FIG. 8 is a structural diagram illustrating a power amplifier for increasing an output power according to still another preferred embodiment of the present invention.

Referring to FIG. 8, differential amplifiers 700a and 700b shown in FIG. 7A are connected to each other, and it is noted that the differential amplifier 700a is connected to the other differential amplifier 700b via the secondary part of the transformer.

Although only two differential amplifiers 700a and 700b are exemplarily used in FIG. 8, it should be noted that two or more differential amplifiers can also be applied to the present invention.

In the meantime, a driving amplifier must be required for the power amplifier, such that it can drive the power amplifier.

According to the present invention, if the driving amplifier uses the PMOS and NMOS transistors as active elements, it must have the output power at which the PMOS and NMOS transistors can be driven.

Generally, since the PMOS transistor has a channel resistance higher than that of the NMOS transistor, the size of the PMOS transistor must be larger than that of the NMOS transistor, so that the PMOS transistor can have the same ON resistance as that of the NMOS transistor. The large-sized PMOS transistor encounters the increased parasitic capacitance between gate and source terminals of the PMOS transistor, and the PMOS transistor can be operated only when the output power is sufficiently received from the driving amplifier.

However, if the injection locking method is used, the power amplifier according to the present invention can be driven using the output power of a relatively-small-sized driving amplifier. Associated examples are shown in FIG. 9.

Figure 9:
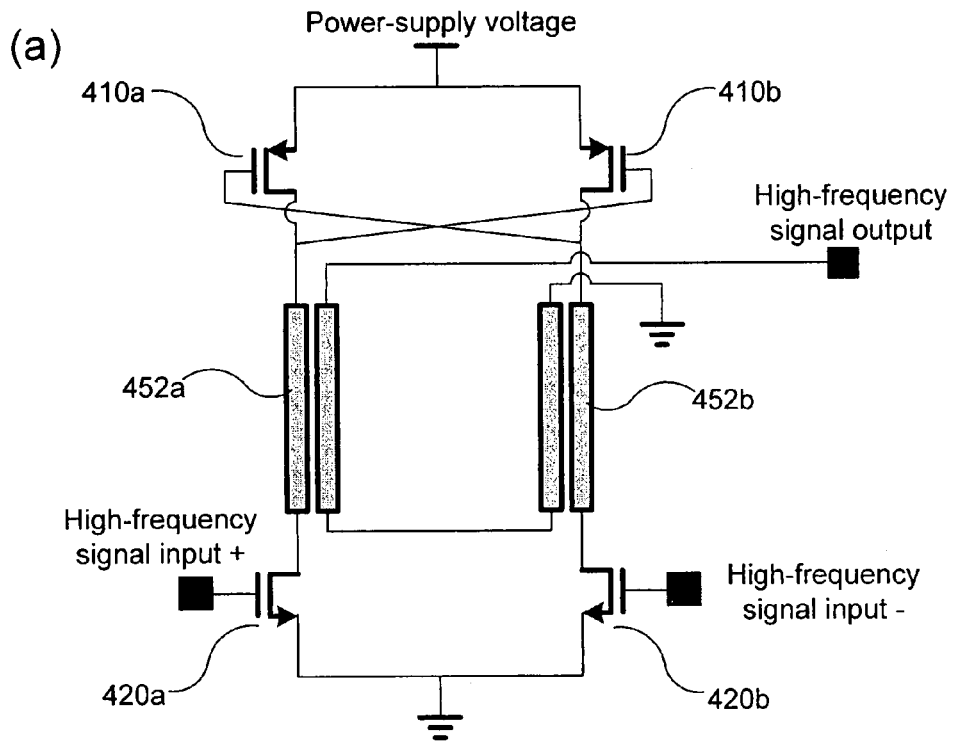
FIG. 9 is a structural diagram illustrating a power amplifier to which an injection locking method is applied according to still another preferred embodiment of the present invention.
Figure 9:
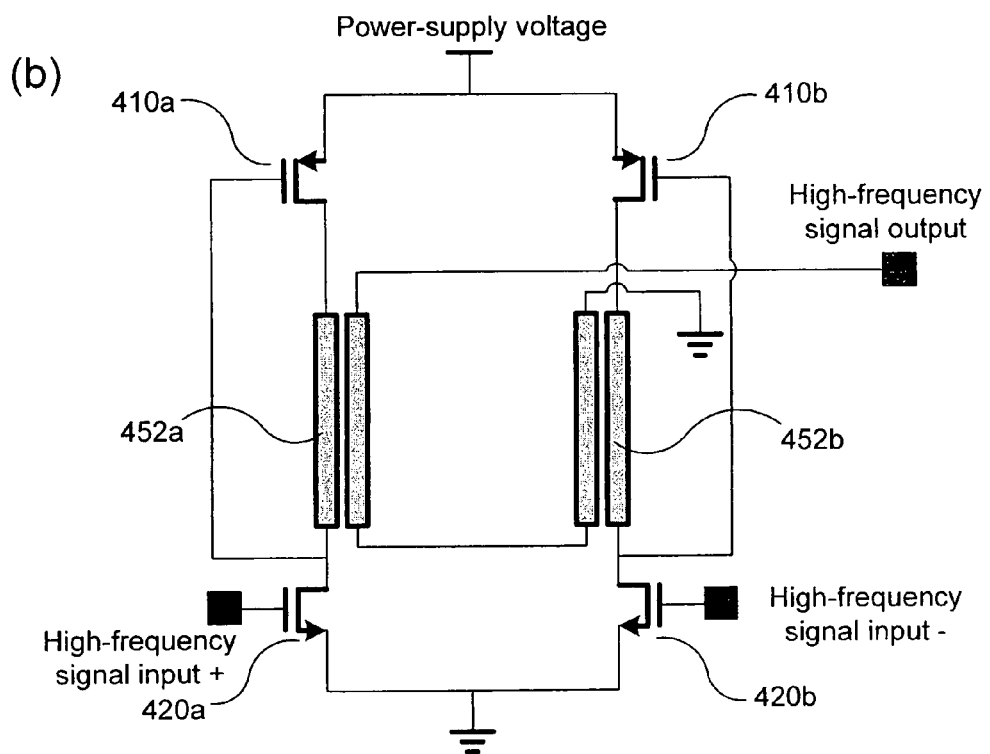

FIG. 9 is a structural diagram illustrating a power amplifier to which an injection locking method is applied according to still another preferred embodiment of the present invention.

In more detail, FIG. 9A shows an exemplary injection locking method in which a gate terminal of a first differential PMOS transistor is connected to a drain terminal of a second differential PMOS transistor, and a gate terminal of the second differential PMOS transistor is connected to a drain terminal of the first differential PMOS transistor.

Referring to FIG. 9A, it can be recognized that a gate terminal of the first PMOS transistor 410a is connected to a drain terminal of the second PMOS transistor 410b, and a gate terminal of the second PMOS transistor 410b is connected to a drain terminal of the first PMOS transistor 410a in the differential amplification structure shown in FIG. 7A.

By the above-mentioned connection, input signals having opposite phases are applied to gate terminals of the first NMOS and PMOS transistor 420a and 410a, and input signals having opposite phases are applied to gate terminals of the second NMOS and PMOS transistors 420b and 410b. In this case, the above-mentioned NMOS and PMOS transistors are connected to each other via the primary part of the transformer.

In this case, the driving amplifier (not shown) is designed to drive only the NMOS transistor, such that it may have a lower output power as compared to another case in which the NMOS and PMOS transistors are simultaneously driven.

And, according to the above-mentioned connection, the gate-source parasitic capacitance of the PMOS transistor may also be used as some parts of the matching circuit of the power amplifier.

Although only the PMOS transistor has been disclosed in FIG. 9A, it should be noted that gate terminals of first and second NMOS transistors constructing a pair of NMOS transistors to form the above-mentioned differential structure may be connected to drain terminals of second and first NMOS transistors, respectively.

FIG. 9B exemplarily shows the power amplifier based on another injection locking method.

Referring to FIG. 9B, gate terminals of PMOS transistors are connected to drain terminals of the NMOS transistors connected to the PMOS transistors via the primary part of the transformer, such that the injection locking technique can be used.

In more detail, the gate terminal of the first PMOS transistor 410a is connected to the drain terminal of the first NMOS transistor 420a, which is connected to the first PMOS transistor 410a via the primary part 452a of the transformer. The gate terminal of the second PMOS transistor 410b is connected to the drain terminal of the second NMOS transistor 420b, which is connected to the second PMOS transistor 410b via the primary part 452b of the transformer.

Similar to the amplifier shown in FIG. 9A, the amplifier of FIG. 9B must enable the driving amplifier to drive only the NMOS transistor, such that the output power required for the driving amplifier can be lowered.

According to the power amplifier of FIG. 9B, the NMOS transistor and the PMOS transistor are connected to each other via the primary part of the transformer, and input signals having opposite phases are applied to gate terminals of the NMOS and PMOS transistors. The above-mentioned injection locking technique may also be easily applied to the circuit of FIG. 8.

Although only the PMOS transistor has been disclosed in FIG. 9B, it should be noted that gate terminals of two NMOS transistors constructing a pair of NMOS transistors to form the above-mentioned differential structure may be connected to drain terminals of PMOS transistors, respectively. In this case, the PMOS transistors are connected to the NMOS transistors via the primary part of the transformer.

Figure 10:
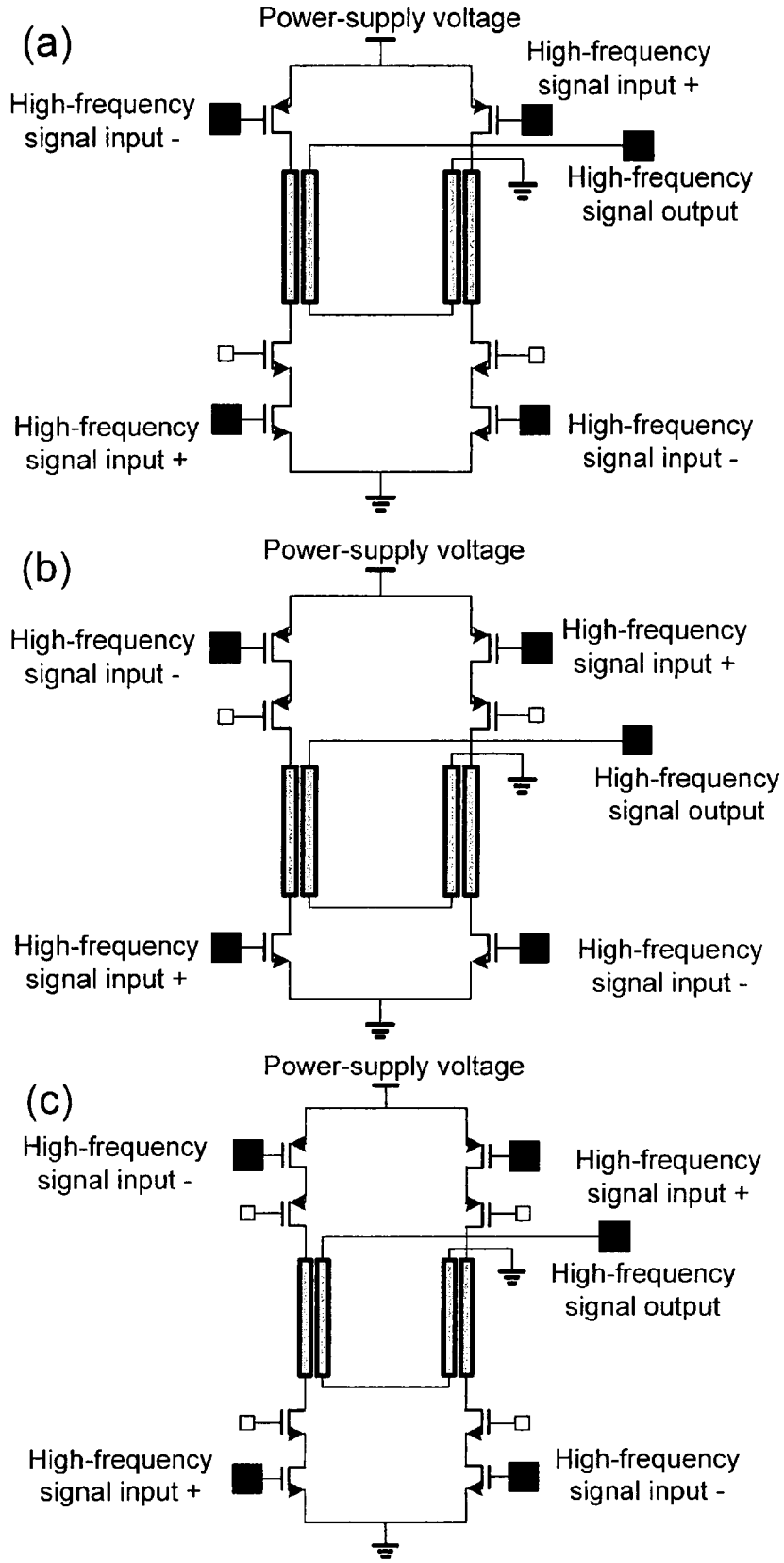
FIG. 10 is a structural diagram illustrating a power amplifier to which a cascode technique is applied according to still another preferred embodiment of the present invention.

In the case of designing the power amplifier driven at a higher power-supply voltage, the power amplifier of FIG. 10 can be used.

FIG. 10 is a structural diagram illustrating a power amplifier to which a cascode technique is applied according to still another preferred embodiment of the present invention.

In this case, the NMOS transistors and/or the PMOS transistors are piled up in the form of a cascode structure as shown in FIGS. 10A, 10B, and 10C. In this case, if the conventional cascode structure is applied to the power amplifier according to the present invention, this application may also be used for the power amplifier driven at a higher power-supply voltage.

Figure 11:
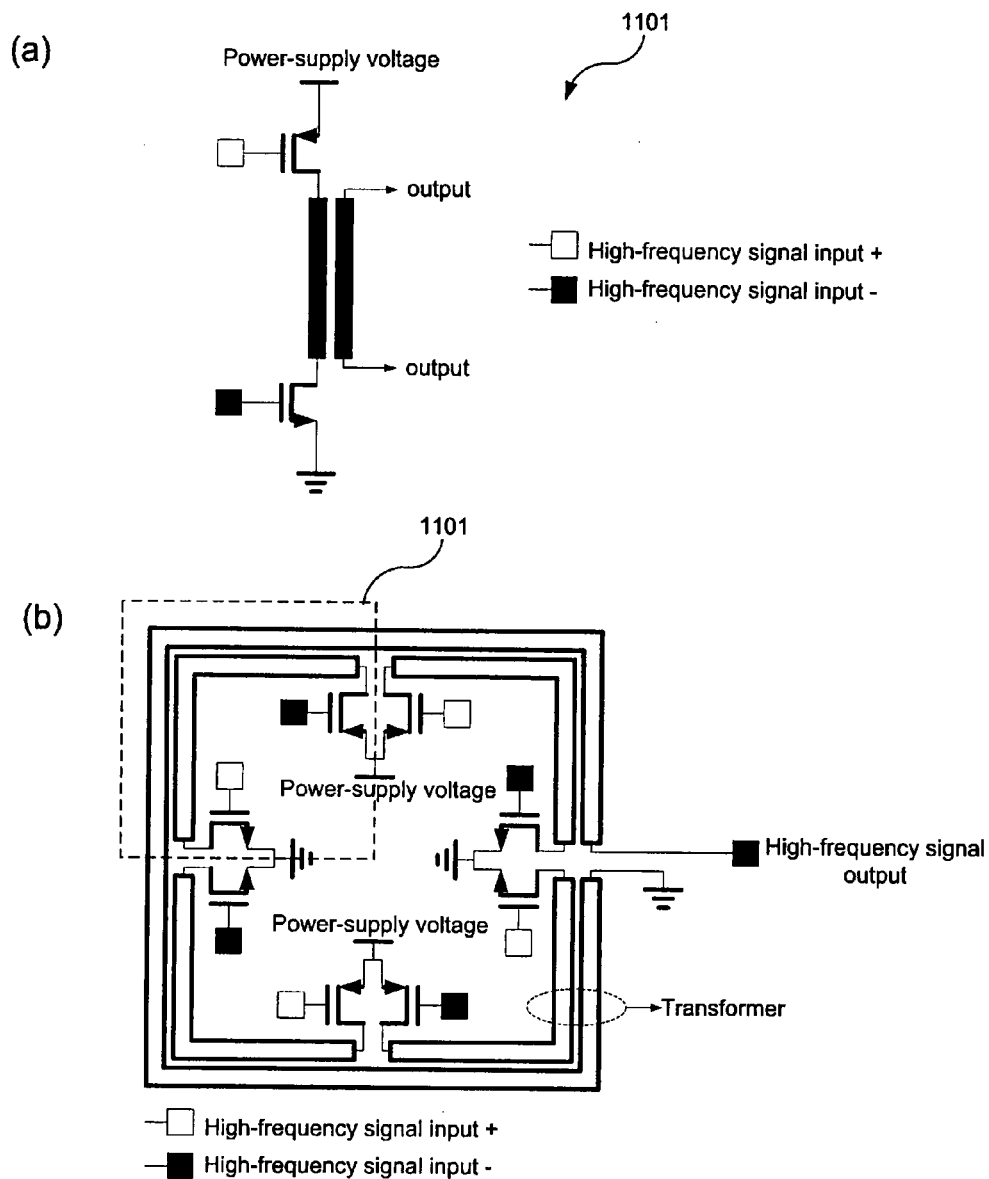
FIG. 11 is a structural diagram illustrating a circular geometry structure differential amplifier according to still another preferred embodiment of the present invention.

FIG. 11 is a structural diagram illustrating a circular geometry structure differential amplifier according to still another preferred embodiment of the present invention.

FIG. 11B shows a circular geometry amplifier equipped with four amplifiers, each of which is shown in FIG. 11A.

Referring to FIG. 11B, it can be recognized that four unit amplifiers 1101 of FIG. 11A are connected to each other via the secondary part of the transformer. The NMOS transistor of each amplifier shares a ground terminal with the NMOS transistor of a neighboring amplifier. The PMOS transistor of each amplifier shares a power-supply voltage with the PMOS transistor of a neighboring amplifier. In this case, provided that input signals having opposite phases are applied to input terminals of the neighboring active elements, the amplifier of FIG. 11B serves as a differential amplifier, and the output powers generated from individual amplifiers are coupled to each other via the secondary part of the transformer.

As apparent from the above description, the power amplifier according to the present invention decreases a potential difference between ports of active elements, thereby improving reliability.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A differential amplifier, comprising:
   a first amplifier connected to a second amplifier, each of the first and second amplifiers including two active elements connected to each other via a primary part of a transformer, one of the two active elements being connected to a power-supply voltage of the amplifier, the other of the two active elements being connected to a ground terminal of the amplifier, an output power appearing in a secondary part of the transformer, the active element connected to the ground terminal being a NMOS (N-type Metal Oxide Semiconductor) transistor, and the active element connected to the power-supply voltage being a PMOS (P-type Metal Oxide Semiconductor) transistor, the first and second amplifiers each including a signal input unit for transmitting input signals having opposite phases to the two active elements; and
   the signal input units being configured to transmit input signals having opposite phases to the two active elements which are connected to the ground terminals and the two active elements which are connected to the power-supply voltages of the first and second amplifiers, wherein
   a ground terminal of the first amplifier is connected to that of the second amplifier,
   a power-supply voltage of the first amplifier is connected to that of the second amplifier, and
   a secondary part of a transformer of the first amplifier is connected to that of the second amplifier, such that output signals of the first and second amplifiers are coupled to each other via the secondary part of the transformer.

2. The differential amplifier according to claim 1, further comprising:
   other differential amplifiers, each of which has the same differential structure as that of the differential amplifier, connected to the differential amplifier via the secondary part of the transformer contained in the first and second amplifiers.

3. The differential amplifier according to claim 1, wherein the two active elements connected to the ground terminals are NMOS transistors, respectively, and the other two active elements connected to the power-supply voltages are PMOS transistors, respectively.

4. The differential amplifier according to claim 3, wherein gate terminals of the two PMOS transistors for constructing a pair of PMOS transistors to form the differential structure are connected to drain terminals of different PMOS transistors.

5. The differential amplifier according to claim 3, wherein gate terminals of the two PMOS transistors for constructing a pair of PMOS transistors to form the differential structure are connected to drain terminals of the NMOS transistors connected via a primary part of the transformer.

6. The differential amplifier according to claim 3, wherein gate terminals of the two NMOS transistors for constructing a pair of NMOS transistors to form the differential structure are connected to drain terminals of different NMOS transistors.

7. The differential amplifier according to claim 3, wherein the NMOS transistors connected to the ground terminals are connected in the form of a cascode structure.

8. The differential amplifier according to claim 3, wherein the PMOS transistors connected to the power-supply voltages are connected in the form of a cascode structure.

9. The differential amplifier according to claim 3, wherein the NMOS transistors connected to the ground terminals and the PMOS transistors connected to the power-supply voltages have a cascode structure.

10. A distributed-type or circular-geometry-type amplifier, comprising:
a plurality of amplifiers, each of the amplifiers including two active elements connected to each other via a primary part of a transformer, one of the two active elements being connected to a power-supply voltage of the amplifier, the other active element being connected to a ground terminal of the amplifier, and an output power appears in a secondary part of the transformer, wherein
wherein the plurality of the amplifiers are connected to each other via the secondary part of the transformer,
a ground terminal connected to an active element of a specific amplifier from among the amplifiers is connected to a ground terminal connected to an active element of a neighboring amplifier, and
a power-supply voltage connected to the active element of the specific amplifier is connected to a power-supply voltage connected to the active element of the neighboring amplifier.

11. The distributed-type or circular-geometry-type amplifier according to claim 10, further comprising:
a signal input unit for transmitting input signals having opposite phases to neighboring active elements.

12. The distributed-type or circular-geometry-type amplifier according to claim 10, wherein the active element connected to the ground terminal is an NMOS transistor, and the active element connected to the power-supply voltage is a PMOS transistor.

13. The distributed-type or circular-geometry-type amplifier according to claim 12, wherein the NMOS transistor has a cascode structure.

14. The distributed-type or circular-geometry-type amplifier according to claim 12, wherein the PMOS transistor has a cascode structure.

15. The distributed-type or circular-geometry-type amplifier according to claim 12, wherein the NMOS and PMOS transistors have a cascode structure.

16. The distributed-type or circular-geometry-type amplifier according to claim 12, further comprising:
a signal input unit for transmitting input signals having opposite phases to neighboring active elements.

* * * * *